US008309845B2

(12) United States Patent
Wood et al.

(10) Patent No.: US 8,309,845 B2
(45) Date of Patent: Nov. 13, 2012

(54) DOUBLE-WING PAD-MOUNTED TRANSFORMER TANK

(75) Inventors: David Brian Wood, White Hall, AR (US); Kenneth W. White, Cabot, AR (US); Ronald J. Stahara, Pine Bluff, AR (US)

(73) Assignee: Central Moloney, Inc., Pine Bluff, AR (US)

( * ) Notice: Subject to any disclaimer, the term of this patent is extended or adjusted under 35 U.S.C. 154(b) by 263 days.

(21) Appl. No.: 12/800,831

(22) Filed: May 24, 2010

(65) Prior Publication Data

US 2011/0284530 A1 Nov. 24, 2011

(51) Int. Cl.
*H05K 5/04* (2006.01)

(52) U.S. Cl. ........ 174/17 LF; 174/50; 336/90; 220/669; 220/608; 220/565

(58) Field of Classification Search .................. 220/660, 220/608, 623, 669, 565, 581, 683, 4.01, 4.12, 220/4.02; 215/382; 336/90; 174/8, 17, 50, 174/52.2, 52, 17 R, 17 LF; D13/110, 152, D13/139, 118, 139.3, 108, 107, 103, 112; D9/522, 561, 417, 559, 523, 430, 609, 529, D9/453, 764, 776, 770, 632; D7/609, 540; 29/460

See application file for complete search history.

(56) References Cited

U.S. PATENT DOCUMENTS 2,915,720 A * 12/1959 Mueller et al. .................. 336/10
3,367,526 A * 2/1968 Schmied et al. ............. 220/4.12
3,784,727 A * 1/1974 Haubein ....................... 174/562
3,841,032 A * 10/1974 Grannis, III .................... 336/65
4,005,341 A 1/1977 Uptegraff, Jr. et al.
4,190,732 A 2/1980 Galloway et al.
4,497,387 A 2/1985 Reiplinger
4,533,786 A * 8/1985 Borgmeyer et al. ............ 174/50
4,556,758 A 12/1985 Warden
D300,408 S * 3/1989 Couri ............................ D9/665
4,963,696 A 10/1990 Owen et al.

(Continued)

FOREIGN PATENT DOCUMENTS

CA 2131568 3/1995

(Continued)

OTHER PUBLICATIONS

Amoiralis, Eleftherios. “Distribution Transformer Cooling System Improvement by Innovative Tank Panel Geometries” Jun. 2012 IEEE Transactions on Dielectrics and Electrical Insulation. vol. 19, No. 3. Discusses alternative geometries of Transformer Tanks.*

(Continued)

*Primary Examiner* — Jacob K Ackun
*Assistant Examiner* — Gideon Weinerth
(74) *Attorney, Agent, or Firm* — Richard Blakely Glasgow

(57) ABSTRACT

An oil-filled, pad-mounted tank for electrical distribution transformers, where the tank includes a front panel, a rear panel, a pair of side panels, a top panel, and a bottom panel that are joined to form an enclosed volume for receiving a transformer core and windings and a quantity of insulating oil. The side panels include a plurality of side panel sections that may include both curved and flat panel sections. Each side panel includes at least one curved panel section that is curved concavely and at least one curved panel section that is curved convexly. Each side panel section may also include one or more flat panel sections.

20 Claims, 10 Drawing Sheets

U.S. PATENT DOCUMENTS

| | | | | | |
|---|---|---|---|---|---|
| 5,056,348 | A | * | 10/1991 | Albrecht et al. | 72/177 |
| D342,523 | S | * | 12/1993 | Morgan et al. | D14/250 |
| D353,361 | S | * | 12/1994 | Nagele et al. | D13/103 |
| 5,527,988 | A | * | 6/1996 | Hernandez et al. | 174/17 LF |
| 5,739,464 | A | * | 4/1998 | Adkins et al. | 174/50 |
| 5,889,231 | A | | 3/1999 | Marusinec et al. | |
| D421,594 | S | * | 3/2000 | Knop et al. | D13/103 |
| D424,026 | S | | 5/2000 | Kabat | |
| D427,903 | S | * | 7/2000 | Forrest | D9/430 |
| D427,978 | S | * | 7/2000 | Kabat | D13/184 |
| D430,022 | S | * | 8/2000 | Goettner | D9/416 |
| 6,114,624 | A | | 9/2000 | Ghafourian et al. | |
| 6,140,572 | A | * | 10/2000 | Book | 174/17 CT |
| 6,522,229 | B2 | | 2/2003 | Laine et al. | |
| 6,914,195 | B2 | | 7/2005 | Archambault et al. | |
| 7,365,625 | B2 | | 4/2008 | Carrasco-Aguirre | |
| 7,414,191 | B2 | * | 8/2008 | Long | 174/50 |
| D621,204 | S | * | 8/2010 | Henry | D7/354 |
| D649,115 | S | * | 11/2011 | Miura | D13/117 |
| 8,232,473 | B2 | * | 7/2012 | Smith et al. | 174/17 LF |
| 2009/0144967 | A1 | * | 6/2009 | Hasu et al. | 29/605 |
| 2010/0294540 | A1 | * | 11/2010 | Smith et al. | 174/17 LF |

FOREIGN PATENT DOCUMENTS

| | | | |
|---|---|---|---|
| JP | 56155520 | * | 12/1981 |

OTHER PUBLICATIONS

Eleftherios I. Amoiralis, “Transformer Design and Optimization: A Literature Survey” Oct. 2009. IEEE Transactions on Power Delievery. vol. 24, No. 4.*

GP Harvey and Rogers. “Distribution Transformers” Wiley Online Encyclopedia Transformer Tank Entry. Chapter 13, p. 318.*

* cited by examiner

DOUBLE-WING PAD-MOUNTED TRANSFORMER TANK

CROSS-REFERENCE TO RELATED APPLICATIONS

Not applicable

STATEMENT REGARDING FEDERALLY SPONSORED RESEARCH OR DEVELOPMENT

Not applicable

BACKGROUND OF INVENTION

1. Field of Invention

The present invention relates to oil-filled, pad-mounted electrical distribution transformers and in particular to a tank for such transformers.

2. Brief Description of the Related Art

Transformers are immersed in one or more liquid or gaseous fluids or combinations of both to ensure their electrical isolation or refrigeration. In order to keep the transformer immersed in one or more fluids, it is required to be contained in a tank.

A conventional tank for a transformer is a generally cube-shaped or rectangular structure that consists substantially of four lateral walls, one horizontal base, and one horizontal cover. The depth, width, and length of the tank is governed by the necessary electrical and mechanical clearances for the core and coil of the transformer. As such, the internal volume of the tank typically ends up so large that it is necessary in some cases to add reinforcing members to prevent the lateral walls and base from being deformed by internal and external pressures. In addition to problems with maintaining the integrity of the tank, because of their size, conventional tanks are expensive to manufacture and to transport.

Variations to the conventional transformer tank structure in the prior art addresses some of these limitations. For example, U.S. Pat. No. 5,527,988 to Hernandez et al. teaches a pad-mounted transformer tank, comprising six vertical walls, designed to increase the strength of the tank and decrease the required oil volume. U.S. Pat. No. 7,365,625 to Carrasco-Aguirre teaches a transformer tank with eight alternating curved vertical pieces and straight vertical pieces. This tank structure likewise decreases the required oil volume of the tank and is claimed to be easier to manufacture.

Even with the improved transformer tank structures of the prior art, considerable volume in the tank is wasted. The volume of the tank is directly related to the volume and cost of oil to occupy the tank, the amount and cost of steel to construct the tank, the weight of the tank, and the integrity of the tank. It would therefore be desirable to develop a pad-mounted transformer tank that is smaller, thus requiring less oil volume and less steel to manufacture. These limitations of the prior art are overcome by the present invention as described below.

BRIEF SUMMARY OF THE INVENTION

The present invention is directed to a pad mount transformer tank with a double-wing structure that is smaller, sturdier, and less expensive to construct. The tank includes a front panel, a rear panel, a pair of side panels, a top panel, and a bottom panel that are joined to form an enclosed volume for receiving a transformer core and windings and a quantity of insulating oil. The side panels include a plurality of side panel sections that may include both curved and flat panel sections. Each side panel includes at least one curved panel section that is curved concavely and at least one curved panel section that is curved convexly. Each side panel may also include one or more flat panel sections.

It is therefore an object of the present invention to provide a transformer tank that is smaller in size, thus requiring less oil volume and less steel to construct. These and other features, objects and advantages of the present invention will become better understood from a consideration of the following detailed description of the preferred embodiment in conjunction with the drawings as described below.

DETAILED DESCRIPTION OF THE INVENTION

Figure 1:
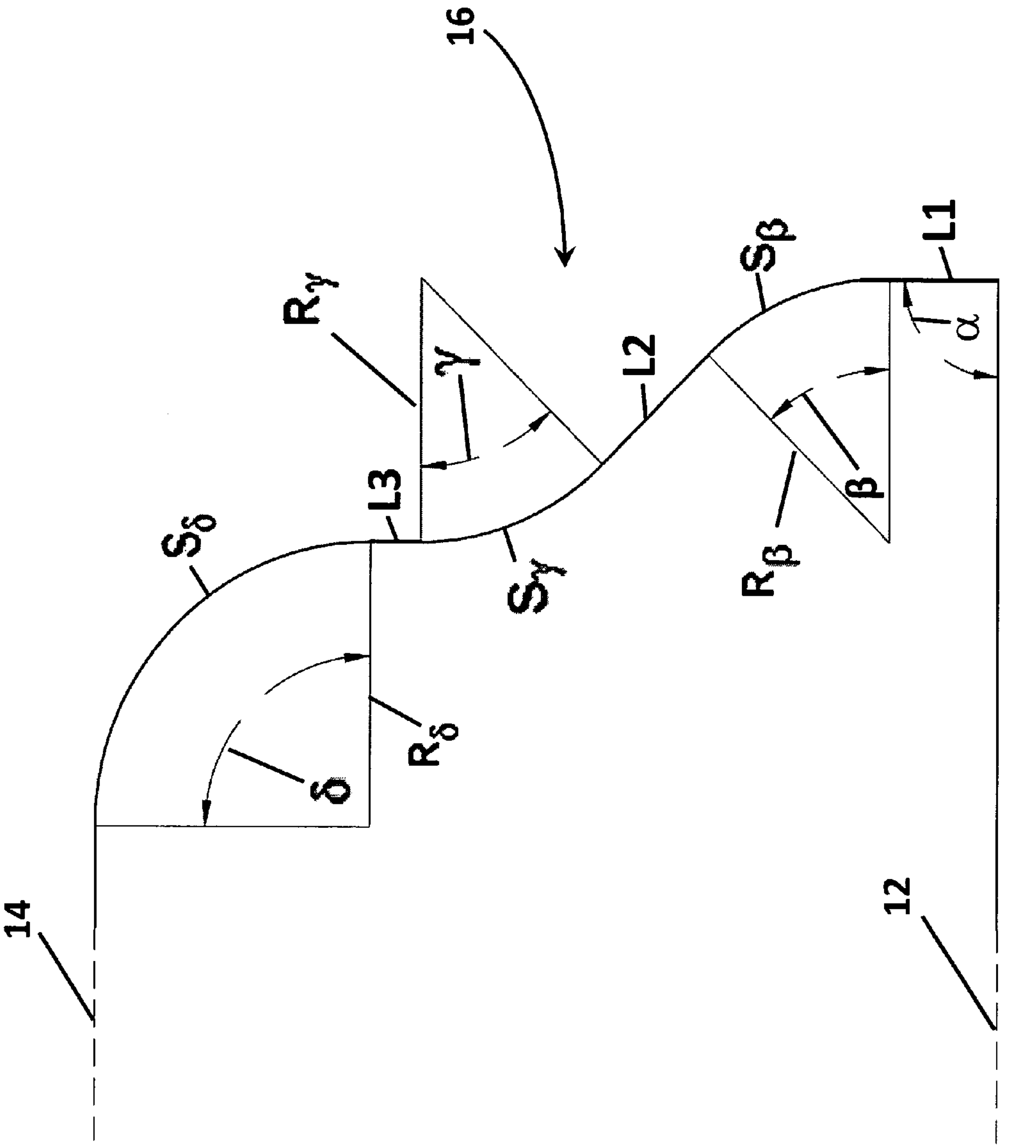
FIG. 1 is a partial top plan cross-sectional view of the right side panel of an embodiment of the transformer tank of the present invention.

With reference to FIGS. 4-10, tank 10 comprises a front panel 12, a rear panel 14, a pair of side panels 16, a top panel 18, and a bottom panel 20 that are joined to form an enclosed volume for receiving a transformer core and windings and a quantity of insulating oil. The front panel 12, rear panel 14, side panels 16, top panel 18, and bottom panel 20 may be formed of any of various materials known in the art, such as steel. The front panel 12 is a substantially flat, preferably rectangular, plate that connects to side panels 16 at respective side edges. Rear panel 14 is likewise substantially flat, preferably rectangular and substantially parallel to front panel 12. Rear panel 14 connects to side panels 16 at respective side edges. Bottom panel 20 connects to front panel 12, side panels 16 and rear panel 14 along lower portions of front panel 12, side panels 16 and rear panel 14. Top panel 18 is connected to front panel 12, side panels 16 and rear panel 14 along upper portions of front panel 12, side panels 16 and rear panel 14. Side panels 16 comprise a plurality of side panel sections, which may include various combinations of flat side panel sections L1, L2, L3 and/or curved side panel sections $S_\beta$, $S_\gamma$, $S_\delta$ as described below.

FIG. 1 shows a top plan view in cross section of right side panel 16. Left side panel 16 is an identical mirror image of the right side panel 16. Right side panel 16 comprises a plurality of side panel sections that may include both curved and flat panel sections. For a specific tank application, all of the side panel sections, both flat and curved, have the same height, which may be set as appropriate for the particular application. A curved panel section is a segment of a vertically oriented cylinder where the horizontal geometry of the segment is defined by a radius and a subtended angle. A particular radius and subtended angle determine the width of the segment of the arc of each curved panel section. Each side panel 16 includes at least one, and preferable only one, curved panel section that is curved concavely, that is the center of the radius defining the panel section is located at a point exterior to the tank. Each side panel 16 may also include at least one curved panel section that is curved convexly, that is the radius for the panel section is located at a point interior to the tank. Each side panel 16 may also include one or more flat panel sections that connect to adjacent panel sections, either curved or flat, at respective side edges to form a single interconnected side panel 16. Preferably, each side panel section joins smoothly to adjacent side panel sections so as to avoid sharp bends within each side panel 16. However, sharp bends between side panels 16 and front panel 12 may be desirable.

In the embodiment of FIG. 1, flat panel section L1 joins front panel 12 at angle $\alpha$. Flat panel section L1 is preferably greater than or equal to 0 inches, but more preferably 0 to 6 inches in width. Angle $\alpha$ is preferably greater than 0° but less than or equal to 90°. More preferably, angle $\alpha$ is 75° to 90°. Flat panel section L1 smoothly segues along a side edge into convexly curved panel section $S_\beta$.

Curved panel section $S_\beta$ is defined by an angle $\beta$ and a radius $R_\beta$. Angle $\beta$ is preferably greater than 0° but less than or equal to 90°. More preferably, angle $\beta$ is 40° to 50°. The width of the arc segment of curved panel section $S_\beta$ is preferably 3 to 4 inches. The radius $R_\beta$ of curved panel section $S_\beta$ is greater than or equal to 0 inches, and more preferably 4 to 5 inches. An opposite edge of curved panel section $S_\beta$ smoothly segues into a side edge of flat panel section L2.

Flat panel section L2 is preferably greater than or equal to 0 inches in width, but more preferably 0 to 3 inches in width. Flat section L2 then smoothly segues into concavely curved panel section $S_\gamma$ of angle $\gamma$ and radius $R_\gamma$.

Angle $\gamma$ is greater than 0° but less than 90°. In the preferred embodiment, angle $\gamma$ is 40°-50°. Preferably angle $\beta$ and angle $\gamma$ are equal. The width of the arc segment of curved panel section $S_\gamma$ is preferably 3 to 4 inches. Radius $R_\gamma$ is greater than or equal to 0 inches, but is preferably 4 to 5 inches long.

Curved panel section $S_\gamma$ then smoothly segues into flat section L3. Flat panel section L3 is preferably greater than or equal to 0 inches in width, but more preferably 0 to 20 inches in width. Flat section L3 then smoothly segues into an convexly curved panel section $S_\delta$ of angle $\delta$ and radius $R_\delta$. Angle $\delta$ is the difference between 180° and angle $\alpha$. In a preferred embodiment, angle $\delta$ is 90° to 105°. The arc segment of curved panel section $S_\delta$ is preferably 0 to 9 inches in width. Radius $R_\delta$ is greater than or equal to 0 inches, but is preferably 0 to 5 inches. Curved panel section $S_\delta$ then smoothly segues into the side edge of rear panel 14. An opposite side edge of rear panel 14 joins left side panel 16 at one side edge of left side panel 16. An opposite side edge of left side panel 16 joins a side edge of front panel 12 opposite to the side edge of front panel 12 that joins right side panel 16 as described above.

Figure 2:
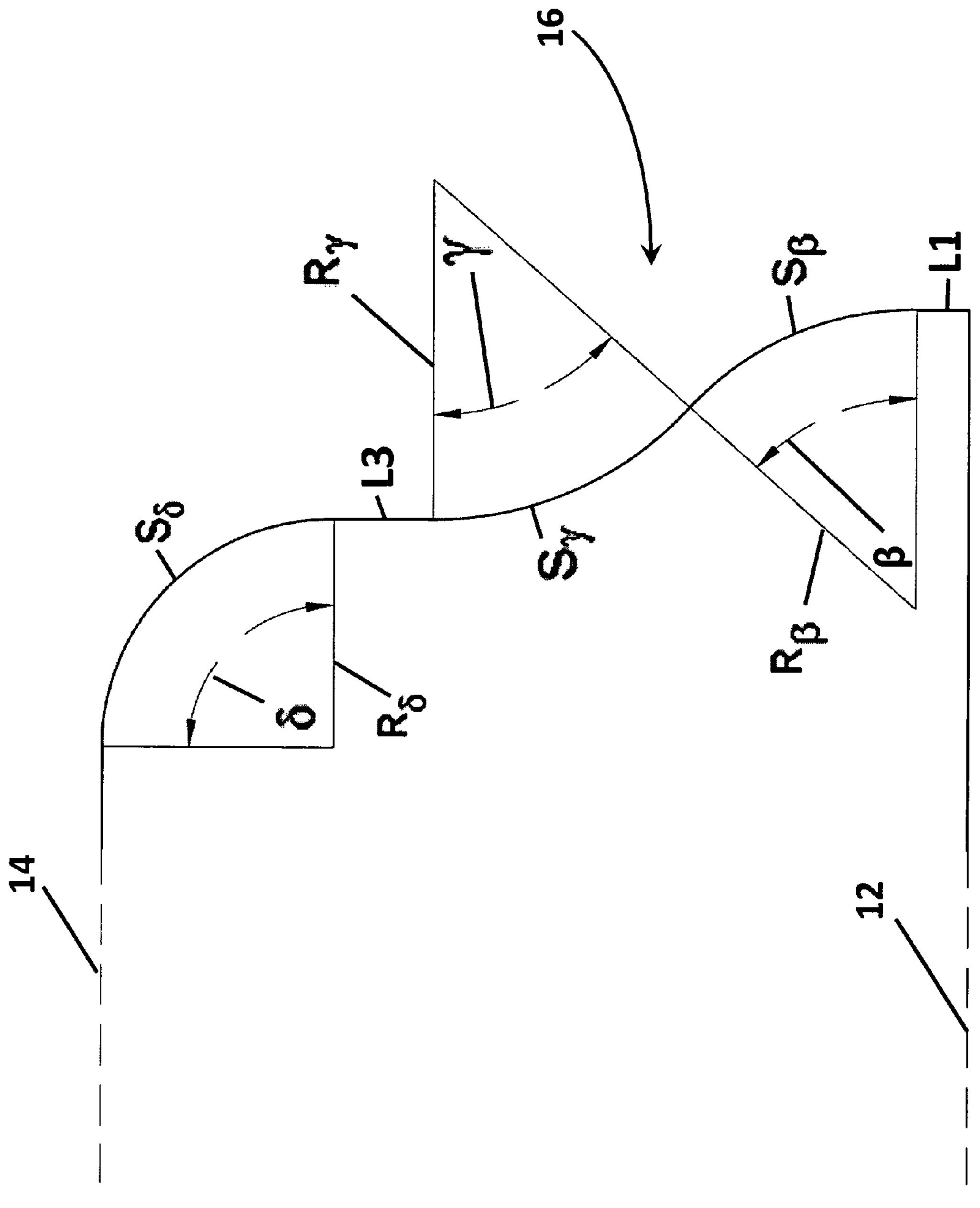
FIG. 2 is a partial top plan cross-sectional view of the right side panel of an alternative embodiment of the transformer tank of the present invention.
Figure 3:
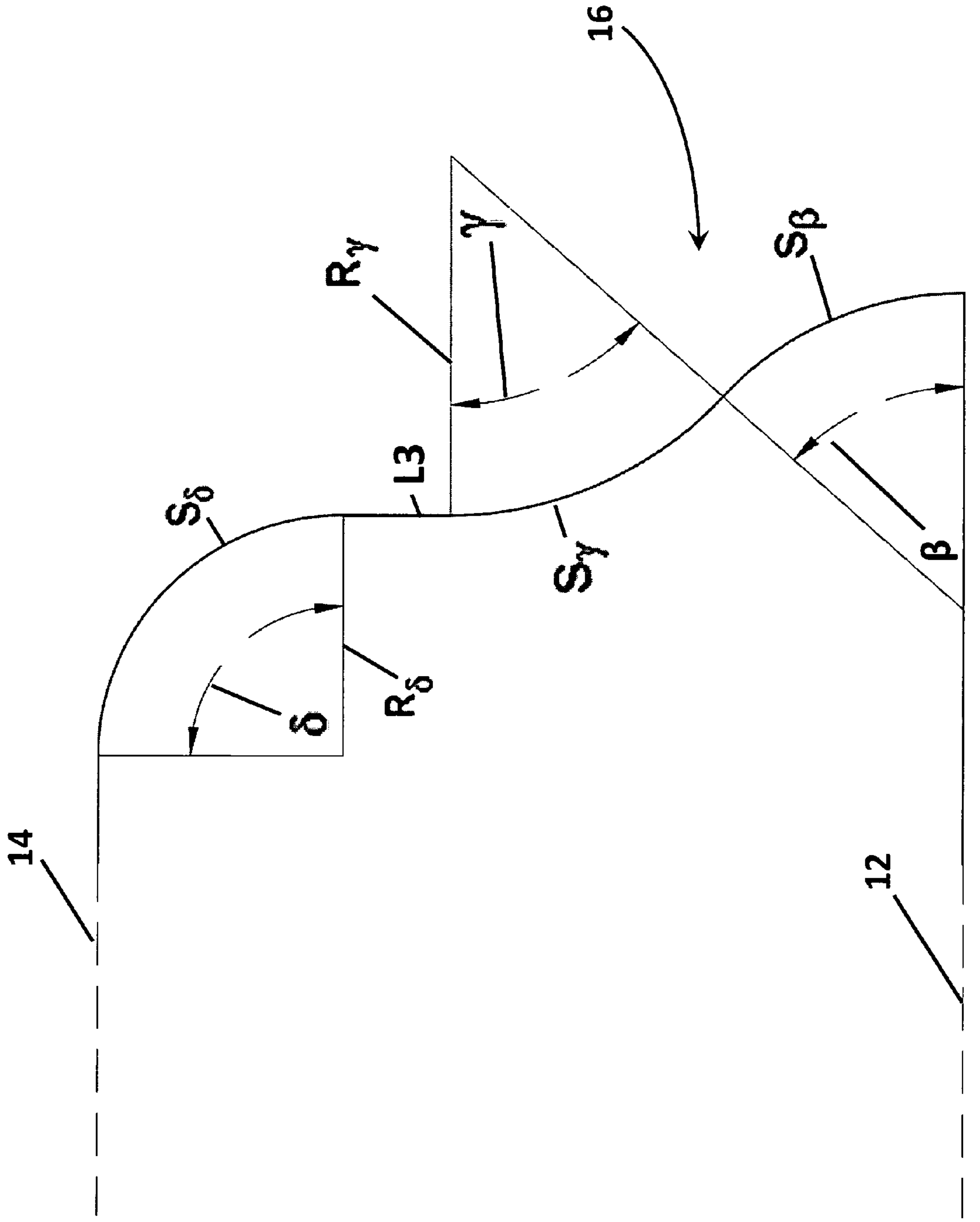
FIG. 3 is a partial top plan cross-sectional view of the right side panel of a further alternative embodiment of the transformer tank of the present invention.
Figure 4:
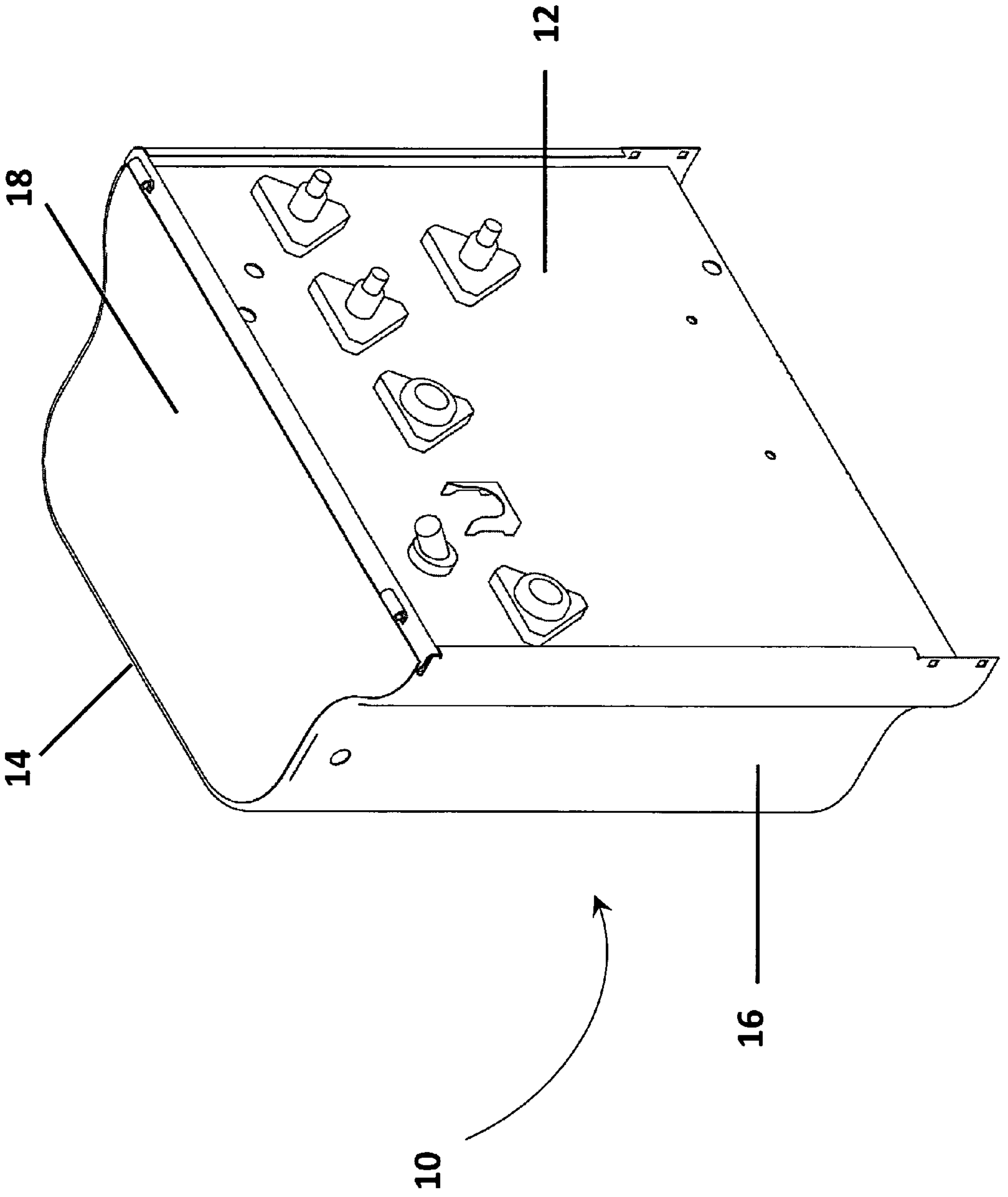
FIG. 4 is a perspective view from the left front top of an embodiment of the transformer tank of the present invention.
Figure 5:
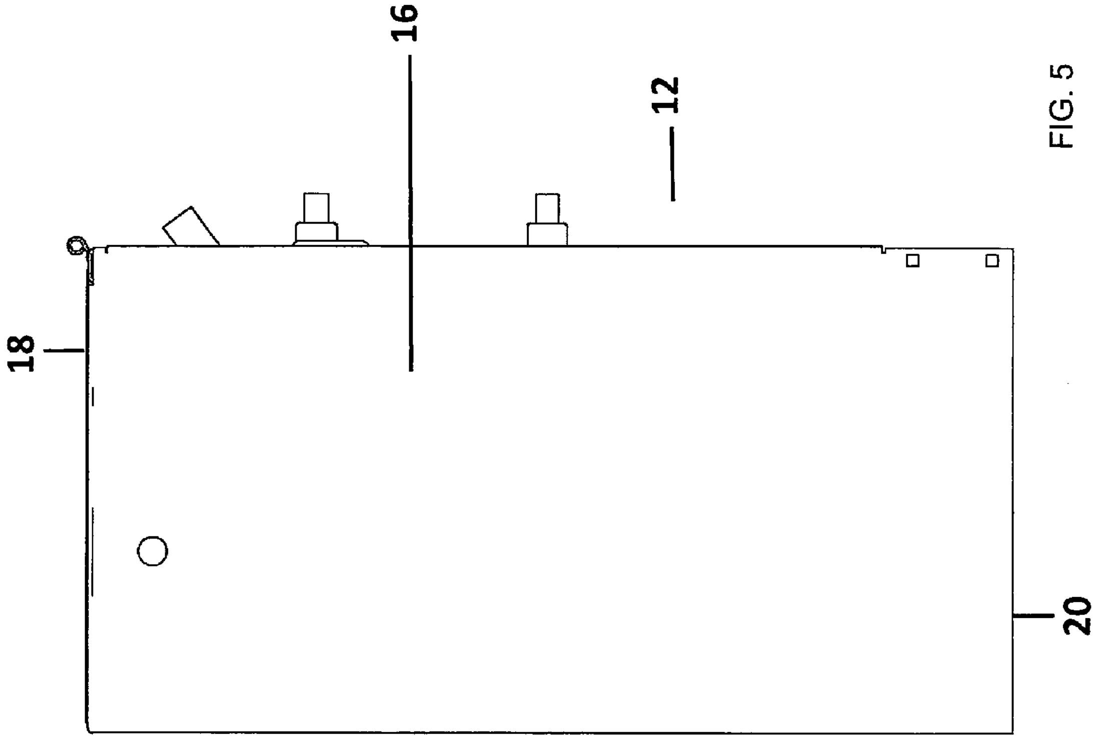
FIG. 5 is a left side elevation view of the embodiment of FIG. 4 of the transformer tank of the present invention.
Figure 6:
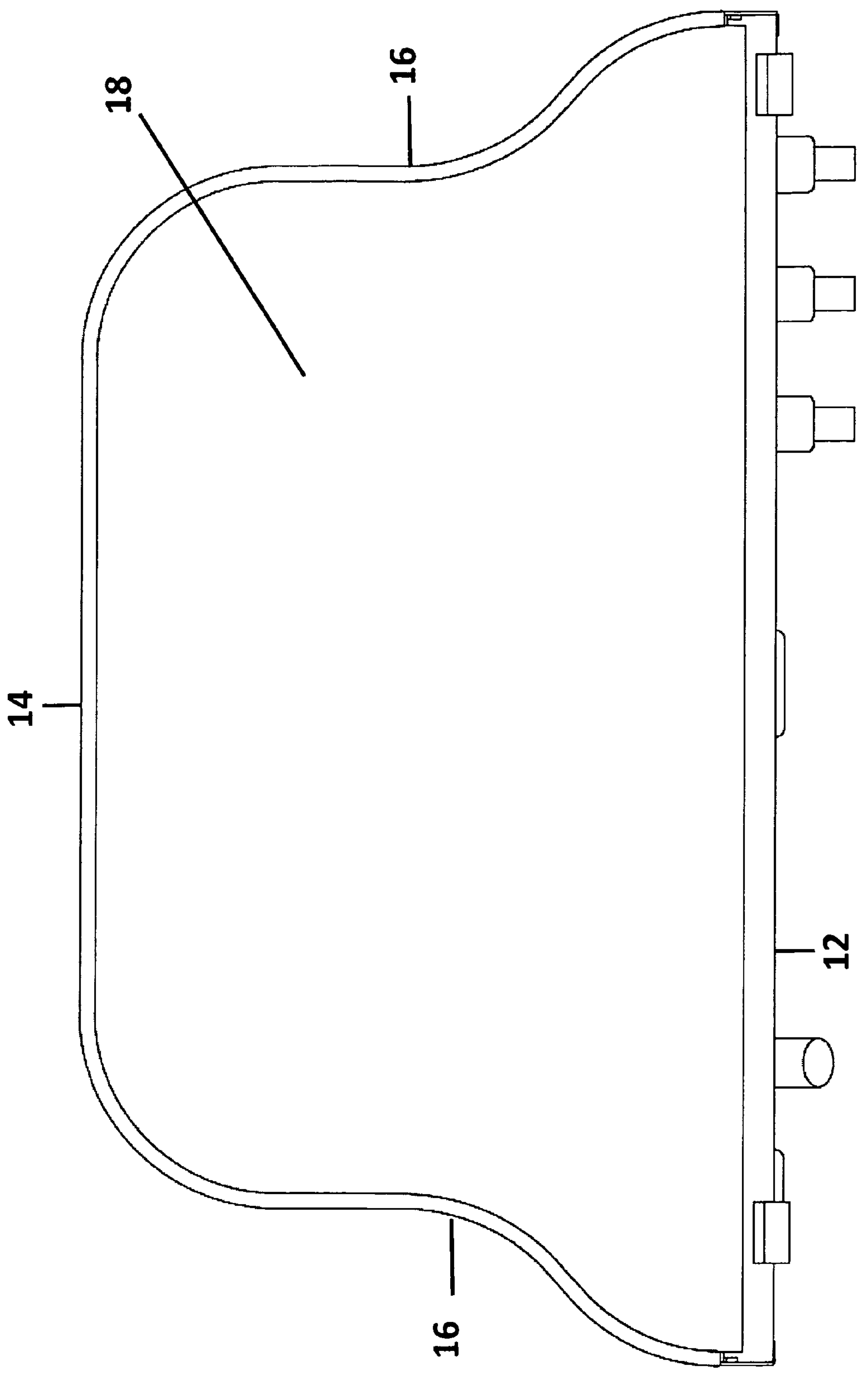
FIG. 6 is a top plan view of the embodiment of FIG. 4 of the transformer tank of the present invention.
Figure 7:
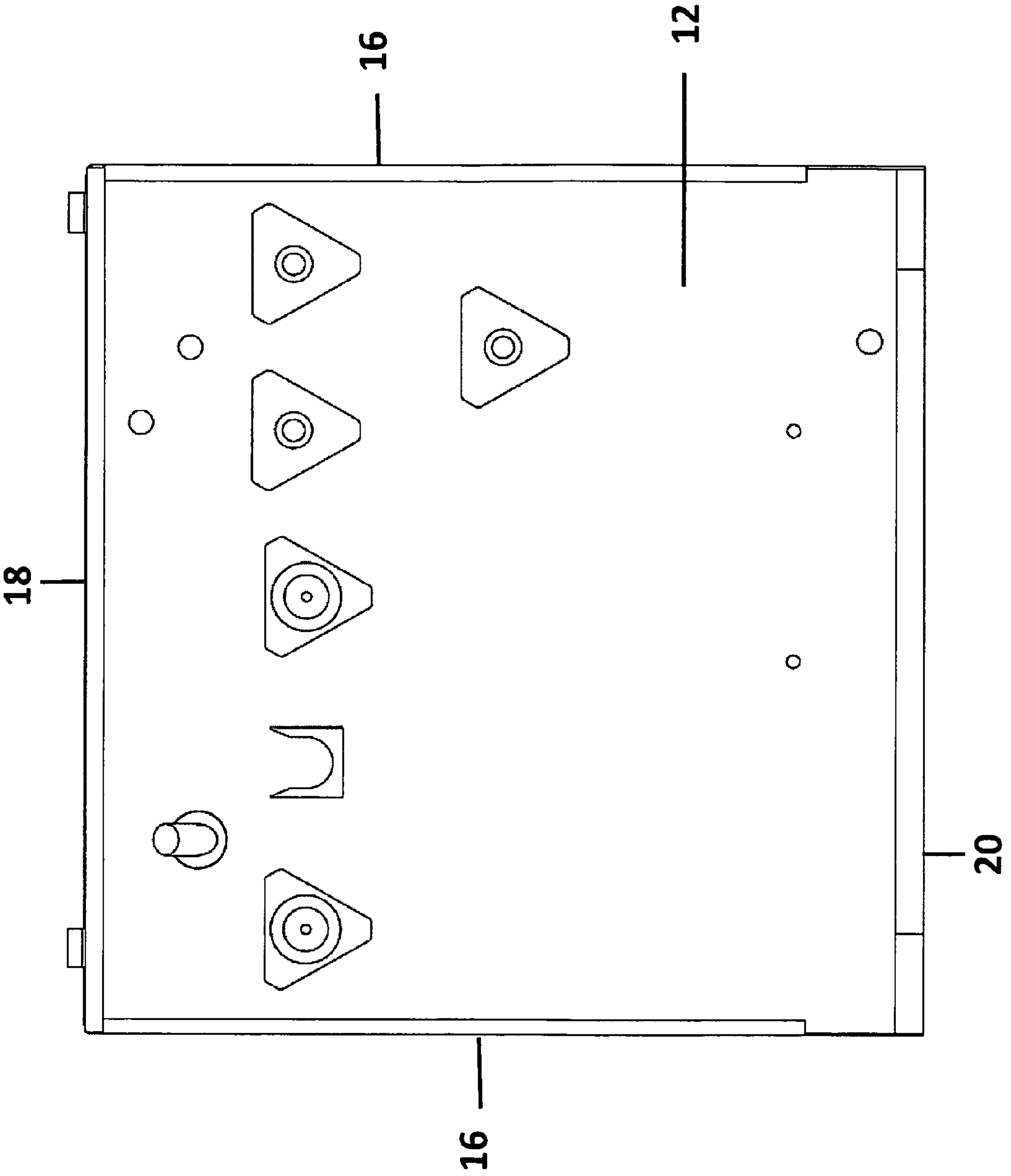
FIG. 7 is a front elevation view of the embodiment of FIG. 4 of the transformer tank of the present invention.
Figure 8:
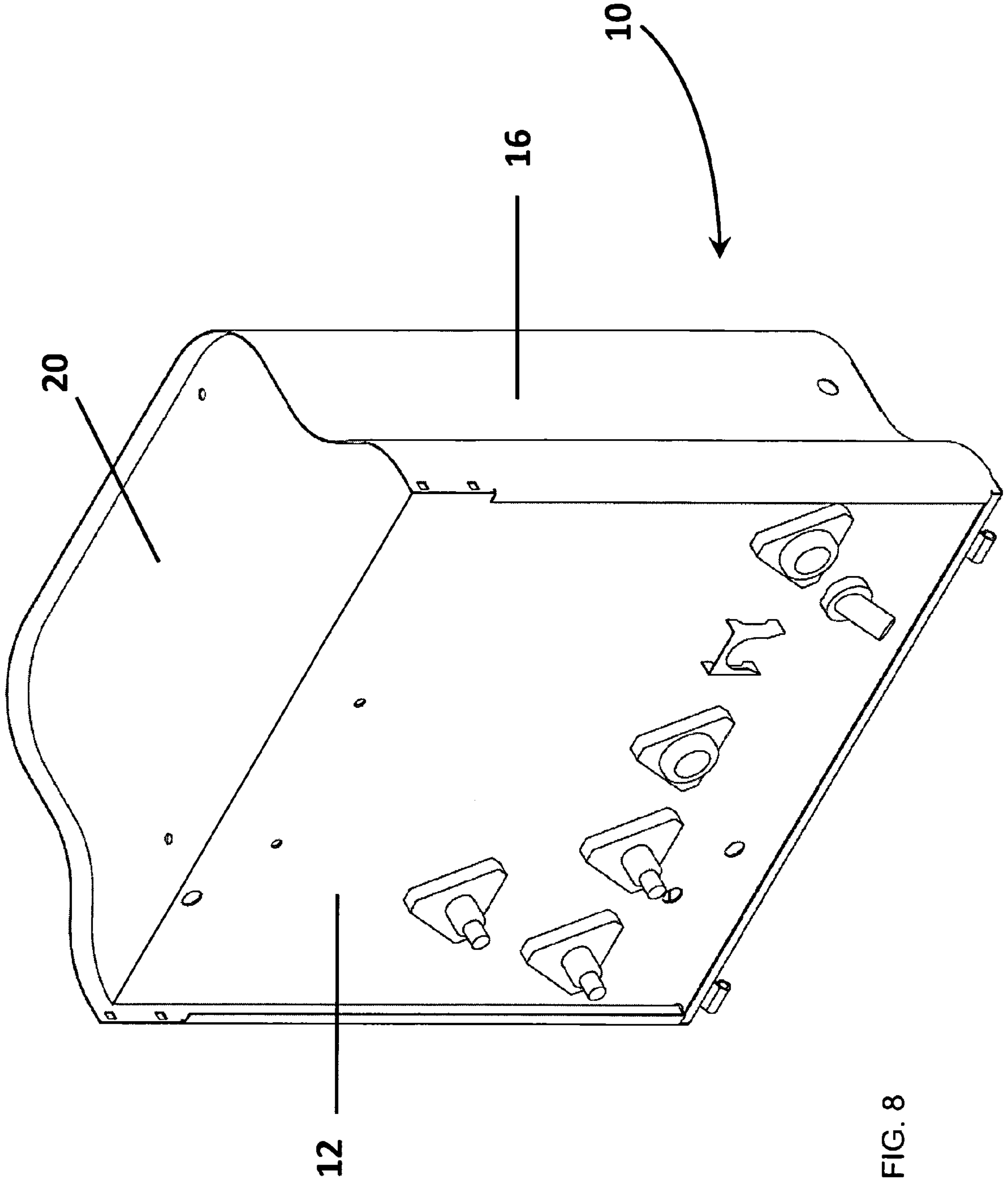
FIG. 8 is a perspective view from the left front bottom of the embodiment of FIG. 4 of the transformer tank of the present invention. Note: the transformer tank is shown upside down from the orientation of the transformer tank in FIGS. 1-7 and 9-10.
Figure 9:
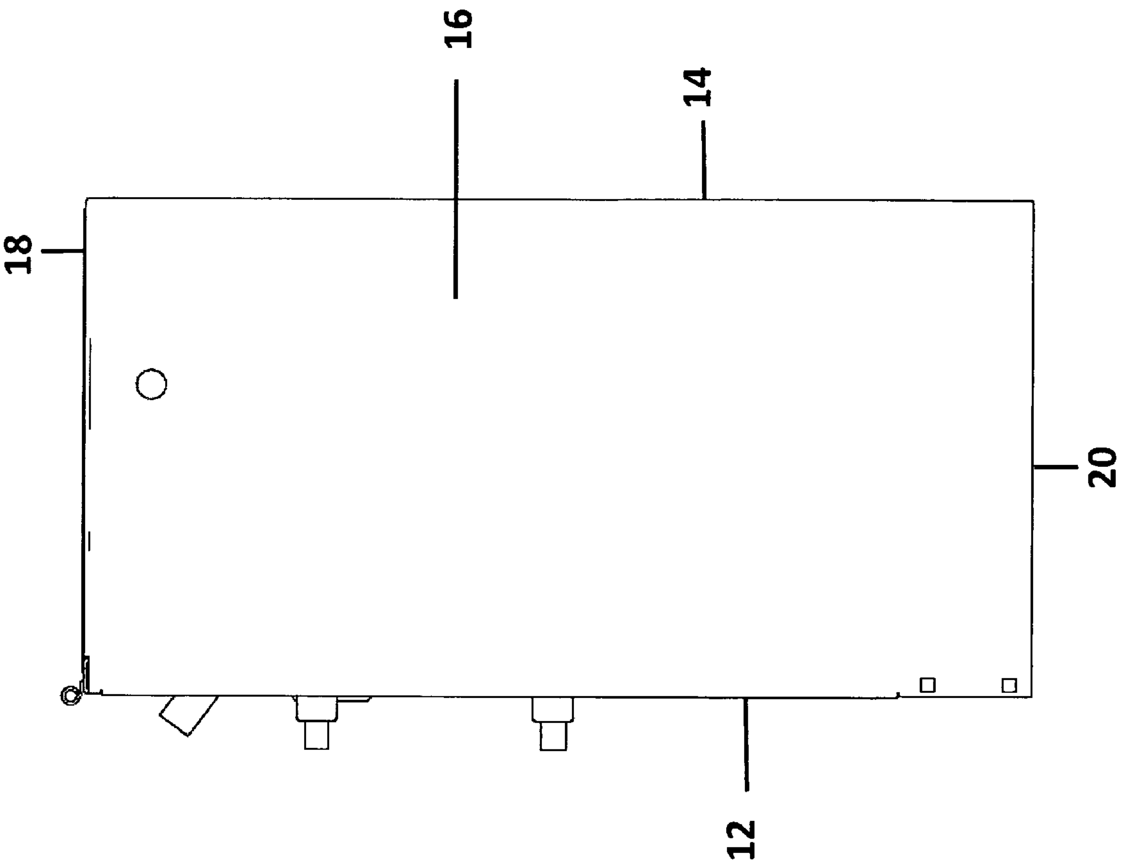
FIG. 9 is a right side elevation view of the embodiment of FIG. 4 of the transformer tank of the present invention.
Figure 10:
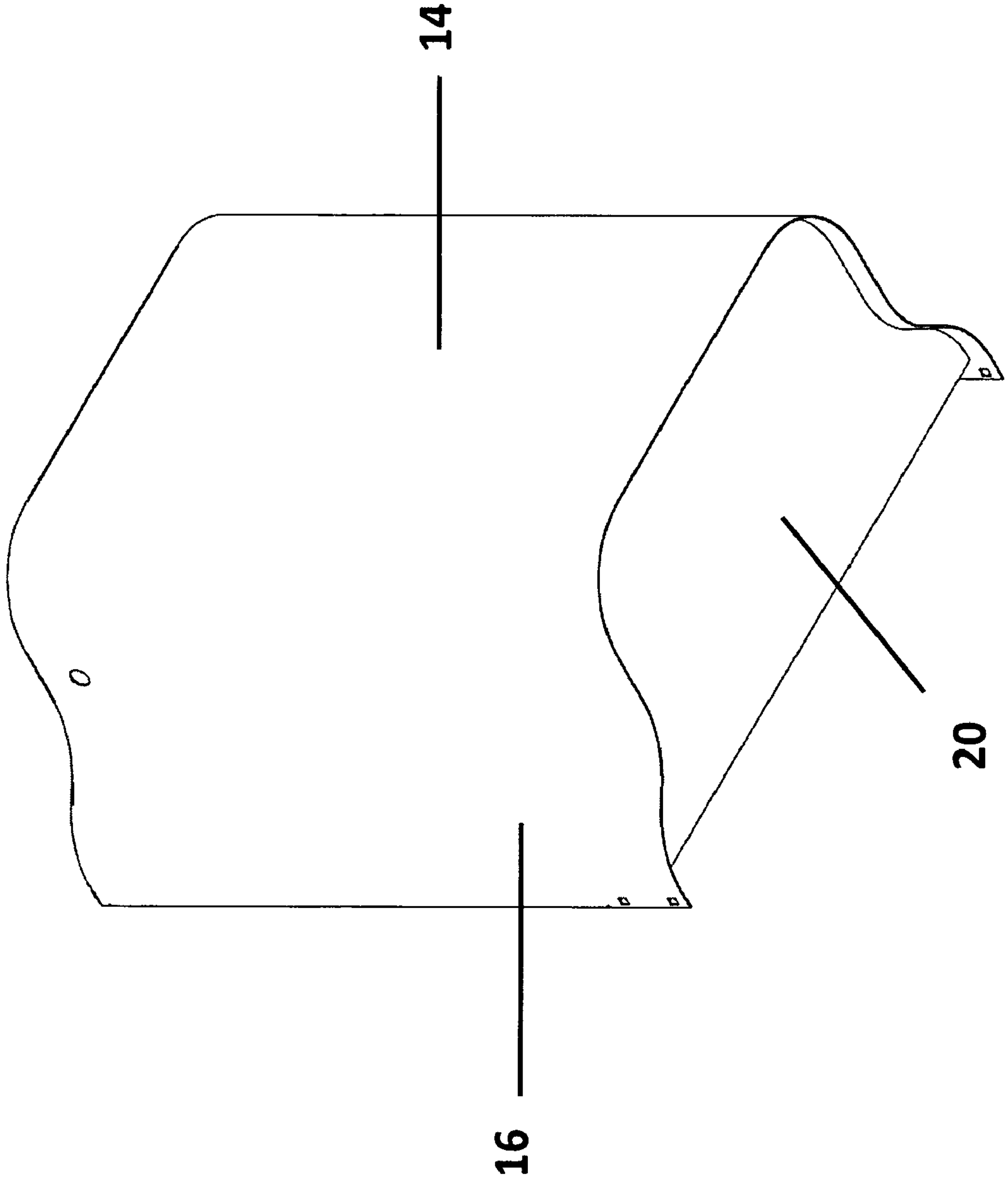
FIG. 10 is a perspective view from the right rear bottom of the embodiment of FIG. 4 of the transformer tank of the present invention.

With reference to FIG. 2-3, further examples of the tank of the present invention may be described. The shape of the transformer tank will vary by inclusion or exclusion of the variable components of the embodiment described above with respect to FIG. 1. Referring now to FIG. 2, an embodiment is shown in which flat side panel section L2 is 0 inches in width, or in other words, curved panel section $S_\beta$ segues directly into curved panel section $S_\gamma$. As shown in FIG. 3, both L1 and L2 are 0 inches in width so that curved panel section $S_\beta$ joins front panel 12 directly at one side edge and at an opposite edge segues directly into curved panel section $S_\gamma$.

The tank structures of the preferred embodiments of the present invention are less voluminous and therefore require less oil or other cooling liquid. The area of steel material comprising the tank is reduced, but without significantly reducing the cooling surface. The reduced steel surface of the tank causes the tank to be lighter and also reduces the amount of paint required on the tank.

Due to the bend in the side panels and because the total unit is lighter, the present invention is more rigid and structurally sound than the tanks of the prior art. The average lifespan of the unit is therefore greater. The tank structure requires less welding which contributes to its structural and paint integrity. Because the tank is lighter and more compact, less material is required in the shipping pallet and less concrete (or other material) is required in the mounting pad. A thinner steel gauge can be used because of the increased rigidity and reduced weight of the tank, thus reducing the steel required even further. Fuel costs and other shipping costs are also reduced as a result of the lighter and more compact design of the tank. Additionally, the smaller tank structure allows a denser arrangement for shipping which enables more units per shipment, thus reducing the number of shipments required.

The benefits mentioned above have the cumulative effect of reducing the wear-and-tear on manufacturing, shipping, and installation equipment, reducing labor and other associated costs, and reducing the carbon footprint of the tank.

The present invention has been described with reference to certain preferred and alternative embodiments that are intended to be exemplary only and not limiting to the full scope of the present invention as set forth in the appended claims.

What is claimed is:

1. A tank comprising:

(a) a front panel;

(b) a rear panel;

(c) a pair of side panels extending between said front panel and said rear panel, wherein each of said side panels comprises a concavely curved panel section joined between a first convexly curved panel section and a second convexly curved panel section;

(d) a top panel joined to upper portions of said front panel, said rear panel and said pair of side panels; and (e) a bottom panel jointed to lower portions of said front panel, said rear panel and said pair of side panels.

2. The tank of claim 1 wherein at least one of said pair of side panels further comprises a second convexly curved side panel section.

3. The tank of claim 1 wherein at least one of said pair of side panels further comprises at least one flat section.

4. The tank of claim 1 wherein at least one of said pair of side panels further comprises at least two flat sections.

5. The tank of claim 1 wherein at least one of said pair of side panels further comprises at least three flat sections.

6. The tank of claim 1 wherein said first convexly curved panel section is defined by a radius and said radius is from 4 to 5 inches.

7. The tank of claim 1 wherein said concavely curved panel section is defined by a radius and said radius is from 4 to 5 inches.

8. The tank of claim 6 wherein said first convexly curved panel section is defined by a subtended angle and said angle ranges from greater than 0° to no greater than 90°.

9. The tank of claim 7 wherein said concavely curved panel section is defined by a subtended angle and said angle ranges from greater than 0° to less than 90°.

10. The tank of claim 1 wherein said second convexly curved panel section is defined by a radius and said radius is 0 to 5 inches.

11. The tank of claim 10 wherein said second convexly curved panel section is defined by a subtended angle and said angle ranges from 90° to 105°.

12. A tank comprising:

(a) a front panel;

(b) a rear panel;

(c) a pair of side panels extending between said front panel and said rear panel, wherein each of said side panels comprises a concavely curved panel section, a first convexly curved panel section, a second convexly curved panel section, and at least one flat panel section, wherein said first convexly curved panel section is joined to said concavely curved panel section, said concavely curved panel section smoothly segues into said flat panel section, and said flat panel section smoothly segues into said second convexly curved panel section;

(d) a top panel joined to upper portions of said front panel, said rear panel and said pair of side panels; and (e) a bottom panel jointed to lower portions of said front panel, said rear panel and said pair of side panels.

13. The tank of claim 12 wherein at least one of said pair of side panels further comprises at least two flat sections.

14. The tank of claim 12 wherein at least one of said pair of side panels further comprises at least three flat sections.

15. The tank of claim 12 wherein said first convexly curved panel section is defined by a radius and said radius is from 4 to 5 inches.

16. The tank of claim 12 wherein said concavely curved panel section is defined by a radius and said radius is from 4 to 5 inches.

17. The tank of claim 15 wherein said first convexly curved panel sections is defined by a subtended angle and said angle ranges from greater than 0° to no greater than 90°.

18. The tank of claim 16 wherein said concavely curved panel section is defined by a subtended angle and said angle ranges from greater than 0° to less than 90°.

19. The tank of claim 12 wherein said second convexly curved panel section is defined by a radius and said radius is 0 to 5 inches.

20. The tank of claim 19 wherein said second convexly curved panel section is defined by a subtended angle and said angle ranges from 90° to 105°.

* * * * *